United States Patent
Yamaoka

(10) Patent No.: US 7,886,257 B2
(45) Date of Patent: Feb. 8, 2011

(54) METHODS FOR HIERARCHICAL NOISE ANALYSIS

(75) Inventor: Hiroaki Yamaoka, Austin, TX (US)

(73) Assignee: Kabushiki Kaisha Toshiba, Tokyo (JP)

( * ) Notice: Subject to any disclaimer, the term of this patent is extended or adjusted under 35 U.S.C. 154(b) by 338 days.

(21) Appl. No.: 12/061,024

(22) Filed: Apr. 2, 2008

(65) Prior Publication Data

US 2009/0254871 A1 Oct. 8, 2009

(51) Int. Cl.
*G06F 17/50* (2006.01)
(52) U.S. Cl. .................... 716/115; 716/103; 716/104; 716/105; 703/14
(58) Field of Classification Search ......... 716/103–105, 716/115; 703/14
See application file for complete search history.

(56) References Cited

U.S. PATENT DOCUMENTS

| | | | | |
|---|---|---|---|---|
| 6,836,873 | B1* | 12/2004 | Tseng et al. ................... | 716/4 |
| 7,007,252 | B2* | 2/2006 | Gyure et al. ................... | 716/5 |
| 7,103,522 | B1* | 9/2006 | Shepard ........................ | 703/14 |
| 7,454,731 | B2* | 11/2008 | Oh et al. ....................... | 716/6 |
| 2006/0015831 | A1* | 1/2006 | Varshney et al. ............... | 716/4 |
| 2007/0010981 | A1* | 1/2007 | Ding et al. .................... | 703/14 |
| 2009/0228851 | A1* | 9/2009 | Abbaspour et al. ............. | 716/6 |

OTHER PUBLICATIONS

Shepard et al.; "Global Harmony: Coupled Noise Analysis for Full-Chip RC Interconnect Networks"; Computer-Aided Design; Digest of Technical Papers; International Conference; 1997; pp. 139-146.*
Shepard, Harmony: Static Noise An. of Deep Submicron Digital Integrated Circuits, IEEE Trans. on Comp. Aided Design of Integrated Circuits and Sys, vol. 18, No. 8, Aug. 1999.

* cited by examiner

*Primary Examiner*—Naum B Levin
(74) *Attorney, Agent, or Firm*—Law Offices of Mark L. Berrier

(57) ABSTRACT

Systems and methods for hierarchical noise analysis of digital circuits, wherein analysis of a cell is based on the configuration of the cell itself and also the upstream circuit components that are connected to the inputs of the cell. One embodiment comprises a method for noise analysis in an electronic circuit such as a digital CMOS circuit. The method includes identifying a cell and identifying the inputs of the cell. For each of the inputs of the cell, a corresponding first upstream circuit component is identified. The identified component is the first component upstream from the cell's input and is directly connected to the input. A noise analysis for the cell is performed based upon the configuration of the cell in combination with the identified upstream circuit components. The result of the analysis for the combination of the cell and the upstream circuit components can then be stored.

10 Claims, 4 Drawing Sheets

METHODS FOR HIERARCHICAL NOISE ANALYSIS

BACKGROUND

1. Field of the Invention

The invention relates generally to the design of electronic circuits, and more particularly to systems and methods for hierarchical noise analysis of digital circuits.

2. Related Art

It is typically a necessary step in the process of designing an electronic circuit to perform some sort of noise analysis. In the case of analog circuits, it is necessary to examine the noise-related characteristics of the circuit because the noise typically presents a lower bound on the useful magnitude of a signal. In other words, if the signal is below a particular level, it cannot be reliably distinguished from the noise and therefore has limited usefulness.

While digital circuits often generate more noise than analog circuits, the nature of digital circuits makes them to much of the noise. Both the generated noise and the circuits' immunity from the noise result from the fact that digital circuits make use of quantized signal levels (typically binary.) The quantization of the signal levels results in rapid changes in voltage which create the noise. The quantization of the signal levels can, however, also allow noisy signals to be reliably interpreted as falling within one of the quantized levels.

As digital circuit technology has advanced, such factors as the scaling of circuit components, the increase of clock speeds and the need for reduced power consumption has led to component and circuit designs that are less tolerant of noise. For instance, power consumption may be reduced by decreasing the operating voltages of the components in the circuit, but these decreased voltages cause reduced separation between quantized signal levels, so that the interpretation of a noisy signal as having a particular signal level is less reliable. As another example, increased clock rates require faster component slew times, which increases the amount of noise in the circuit.

Noise analysis of digital circuits has therefore become an increasingly important part of the design process. Similar to other parts of the design process, noise analysis has become increasingly complex as the scale of the designs (e.g., the number of circuit components) increases. It is therefore desirable to provide means to increase the speed and improve the efficiency of noise analyses. One way in which this is accomplished is the use of hierarchical noise analysis.

Hierarchical noise analysis takes advantage of the fact that digital circuit designs typically employ many instances of identical cells, or groups of circuit components. For example, a design may incorporate many identical sense amplifiers to read data from registers, or identical multiplexers to control data flow. Hierarchical noise analysis assumes that the noise analysis for a particular group of circuit components (a cell) will be the same, whether that cell is used in one place in the circuit, or in another place in the circuit. Thus, if a cell is analyzed once, there is no need to analyze that cell again—the result of the first analysis is used for any subsequent instances of the cell within the circuit design. This principle of re-use is applied to each of the cells that occurs multiple times in the circuit design. The re-use of the noise analysis results for identical cells substantially reduces the computational requirements for the noise analysis of the entire circuit design.

While this conventional type of hierarchical noise analysis can require substantially less computational resources than previous noise analysis methodologies, it has several problems of its own. One of these problems is that it assumes that the noise output by an upstream cell is identical to the noise received by a downstream cell. In fact, this is not necessarily true. The noise received by the downstream cell may be affected by such things as the configuration of the wires and terminals between the output of the upstream cell and the input of the downstream cell. The noise may also be affected by factors such as gate leakage at the input terminal of the downstream cell. The failure of conventional hierarchical noise analysis to take these factors into account introduces error into the analysis results.

It would therefore be desirable to provide systems and methods for performing hierarchical noise analysis that does not include errors arising from the assumption that the noise analysis is identical for identical cells whose inputs are connected to different upstream circuit components.

SUMMARY OF THE INVENTION

One or more of the problems outlined above may be solved by the various embodiments of the invention. Broadly speaking, the invention includes systems and methods for hierarchical noise analysis of digital circuits, wherein analysis of a cell is based not only on the configuration of the cell itself, but also takes into account the upstream circuit components that are connected to the inputs of the cell.

One embodiment comprises a method for noise analysis in an electronic circuit such as a digital CMOS circuit. The method includes identifying a cell and identifying the inputs of the cell. For each of the inputs of the cell, a corresponding first upstream circuit component is identified. The identified component is the first component upstream from the cell's input and is directly connected to the input. A noise analysis for the cell is performed based upon the configuration of the cell in combination with the identified upstream circuit components. The result of the analysis for the combination of the cell and the upstream circuit components can then be stored.

This method of analyzing an individual cell can be utilized in the hierarchical noise analysis of the overall circuit. The cell-level method is repeated for each unique combination of a cell and its corresponding upstream circuit components. Thus, not only each different cell, but each different combination of a cell and its corresponding upstream components is analyzed. For subsequent occurrences of a particular combination of a cell and its upstream components, the stored result of the first analysis of the combination is used instead of re-analyzing the combination.

The hierarchical noise analysis is performed on upstream cells first, then downstream cells. The noise output from the upstream cells is input to the succeeding downstream cells to determine the noise characteristics of the circuit. The configuration of each cell is identified from the cell's netlist, and the upstream circuit components are identified from the netlists of the upstream cells. The noise output of the upstream cells is retrieved from the stored noise analysis results for those cells.

Another embodiment comprises a software product. The software product includes a computer-readable storage medium, such as a CD, DVD, memory device, or the like. The storage medium contains (has stored therein) software program instructions which cause a computer system to perform the methods described herein (such as the ones above.)

Numerous additional embodiments are also possible.

The various embodiments of the present invention may provide a number of advantages over the prior art. For example, by taking into account the complete configuration of wires and terminals between the cells of a circuit, the overall noise analysis for the circuit will be more accurate than the analysis produced by conventional methodologies. Still other advantages may also be provided.

BRIEF DESCRIPTION OF THE DRAWINGS

Other objects and advantages of the invention may become apparent upon reading the following detailed description and upon reference to the accompanying drawings.

Figure 1:
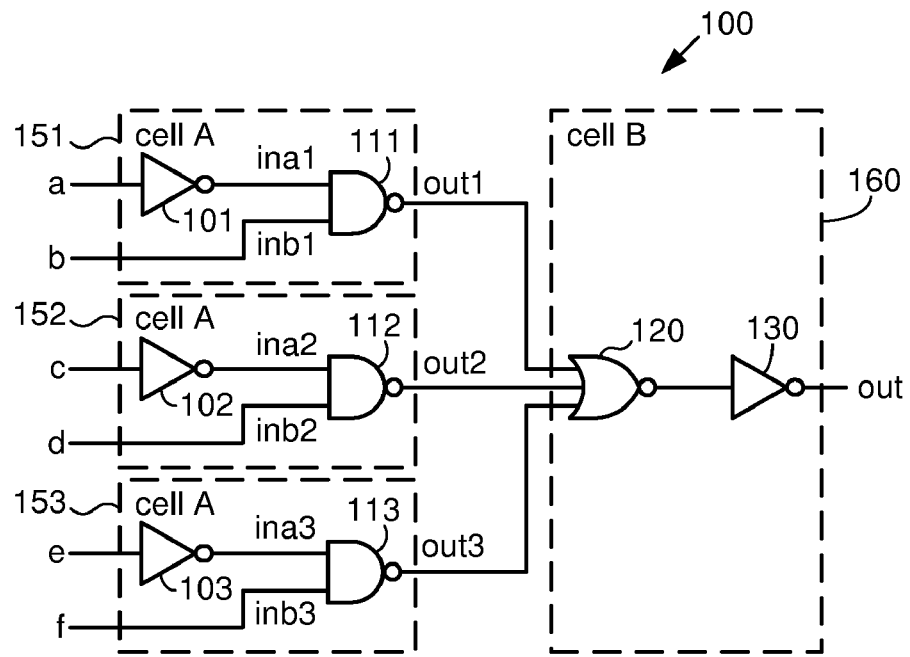
FIG. 1 is a diagram illustrating a simple, static digital circuit and the use of multiple, identical cells.

While the invention is subject to various modifications and alternative forms, specific embodiments thereof are shown by way of example in the drawings and the accompanying detailed description. It should be understood that the drawings and detailed description are not intended to limit the invention to the particular embodiments which are described. This disclosure is instead intended to cover all modifications, equivalents and alternatives falling within the scope of the present invention as defined by the appended claims.

DETAILED DESCRIPTION OF EXEMPLARY EMBODIMENTS

One or more embodiments of the invention are described below. It should be noted that these and any other embodiments described below are exemplary and are intended to be illustrative of the invention rather than limiting.

Broadly speaking, the invention includes systems and methods for hierarchical noise analysis of digital circuit designs, wherein analyses of cells that are used multiple times in the design are dependent upon upstream circuit components that are connected to the inputs of the cells.

One embodiment of the invention comprises a method for performing hierarchical noise analysis of a digital circuit design. The method includes identifying cells (groups of circuit components) that are used multiple times in the design of the circuit, performing a noise analysis for each unique combination of the cell configuration and the upstream circuit components coupled to its inputs, and then re-using the results of the analysis for each combination whenever the combination occurs in the design.

The first part of the method is identifying the cells of the circuit design. This is accomplished in essentially the same manner as in conventional methodologies. It is simply a matter of identifying groups of circuit components, or cells. Some of these groups of components occur in the same configuration multiple times within the design. Conventionally, each occurrence (or instance) of the group of components is treated identically, so that the noise analysis for a particular cell is the same, regardless of where the cell appears in the design, or to what upstream components the cell is connected.

In the present method, not all occurrences of a particular cell are handled identically. As noted above, the noise analysis of a particular cell may change, depending upon the particular circuit components to which the inputs of the cell are connected. The present method therefore includes identification of the upstream circuit components connected to the inputs of the cell. It is this combination of the cell and the corresponding upstream circuit components upon which the noise analysis is performed.

As used herein, "upstream" refers to the fact that the circuit components are coupled to the inputs of the cell, so that signals flow from the upstream circuit components to the inputs of the cell. Both the circuit components connected directly to the inputs of the cell being analyzed and the cells which contain these components may be referred to herein as "upstream." Conversely, the cell being analyzed may be referred to herein as being "downstream" from the upstream components or cells.

The hierarchical noise analysis for the entire circuit design is completed by performing a noise analysis of each cell or re-using the results from the analysis of an identical cell, the inputs of which are connected to identical components. The cells are analyzed generally beginning with upstream cells and proceeding to downstream cells. In the circuit-level analysis, the noise analysis result for each cell is re-used, not for all occurrences of the cell, but only for those occurrences of the cell having the same combination of upstream circuit components.

It will be helpful to describe conventional hierarchical noise analysis before describing embodiments of the present invention. Conventional article noise analysis will be explained in connection with the FIG. 1, while the present methodology will be explained with reference to FIG. 2.

Referring to FIG. 1, a simple digital circuit 100 is shown. The circuit has six inputs which receive signals a-f, and a signal output which produces a signal out. Signals a, c and e are applied to the inputs of inverters 101-103, respectively. Inverters 101-103 invert these signals and apply the inverted signals to inputs of NAND gates 111-113, respectively. At the inputs to the NAND gates, the inverted signals are identified as ina1, ina2 and ina3, respectively. Input signals b, d and f are also applied to respective inputs of NAND gates 111-113 as signals inb1, inb2 and inb3. NAND gates 111-113 produce outputs out1, out2 and out3, respectively. Signals out1, out2 and out3 are then provided as inputs to NOR gate 120. The output of NOR gate 120 is applied as an input to inverter 130, and the output of inverter 130 is provided as the output signal, out, of circuit 100.

Rather than viewing circuit 100 as a collection of eight individual circuit components, it can be viewed as a combination of cells, where each cell is a particular configuration of circuit components. In this example, cell A (e.g., 151) consists of an inverter (e.g., 101) and a NAND gate (e.g., 111.) In this cell, a first input to the cell (e.g., signal a) is applied to the input of the inverter, and a second input to the cell (e.g., signal b) is applied to one of the inputs of the NAND gate. The output of the inverter is applied to the other input of the NAND gate. The output of the NAND gate is then provided as the output of the cell. It can be seen in the figure that this particular configuration of circuit components (cell A) occurs three times (151, 152, 153.) Cells 151-153 may be referred to as occurrences or instances of cell A. Circuit 100 also includes a second cell 160 (cell B.) Cell B has three inputs and one output. The signals received at the three inputs are applied to the inputs of NOR gate 120. The output of NOR gate 120 is applied as an input to inverter 130. The output of inverter 130 is then provided as the output of cell B.

In a conventional hierarchical noise analysis, a noise analysis would be performed on the configuration of cell A, the configuration of cell B, and any other cells that are present in the circuit design (assuming circuit 100 is part of a larger circuit.) Because cells 151-153 are identical, the result of the analysis of cell A's configuration would be used for each of cells 151-153. The same result is used for each of these cells, regardless of the components connected to any of the cells' inputs. The noise analysis result for cell B would likewise be reused for each occurrence of cell B in the larger circuit design. In essence, the noise analysis for a particular cell does not take into account anything outside the boundaries of the cell.

Figure 2:
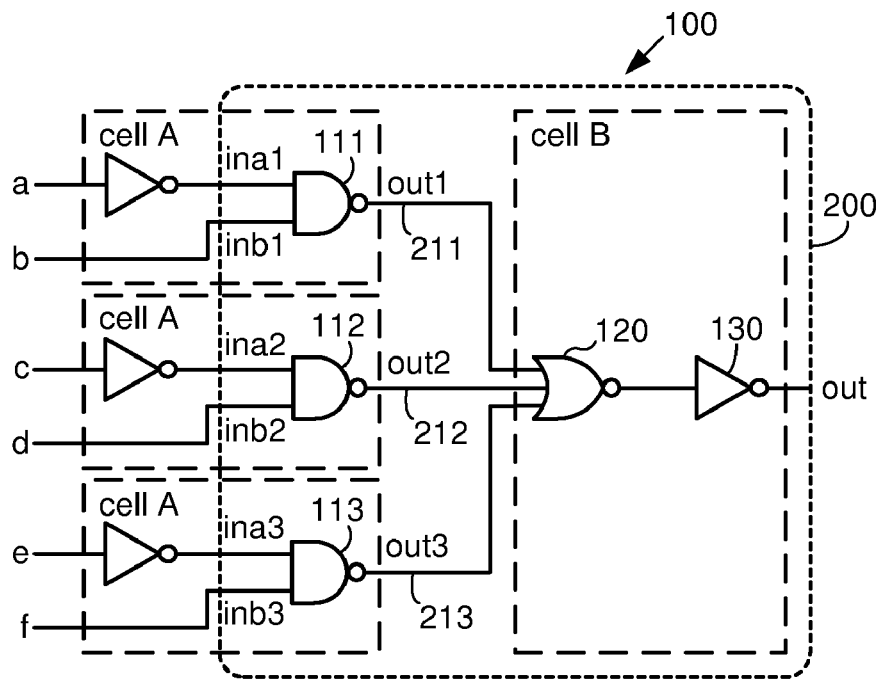
FIG. 2 is a diagram illustrating the incorporation of information from upstream circuit components in the analysis of a cell in a static digital circuit in accordance with one embodiment.

In the present method, however, information other than the mere configuration of the cell being analyzed is considered when performing the noise analysis of the cell. Specifically, the first upstream component connected to each of the inputs to the cell is also considered. This is illustrated in FIG. 2. Referring to FIG. 2, circuit 100 is again shown. In this figure, however, box 200 (shown by the dotted line) indicates that the analysis of cell B includes not only NOR gate 120 and inverter 130, as in a conventional analysis, but also NAND gates 111-113. NAND gate 111 is included because it is the first upstream component connected to input 211. NAND gates 112 and 113 are included in the noise analysis because these are the first upstream circuit components connected to inputs 212 and 213, respectively.

As noted above, "upstream" components are components from which signals are received at the inputs of the cell being analyzed. It should also be noted that upstream components are external to the cell which is being analyzed. Because components which are downstream from the cell being analyzed do not affect the noise analysis of the cell under consideration, these downstream components are not included in the analysis of the cell.

Figure 3:
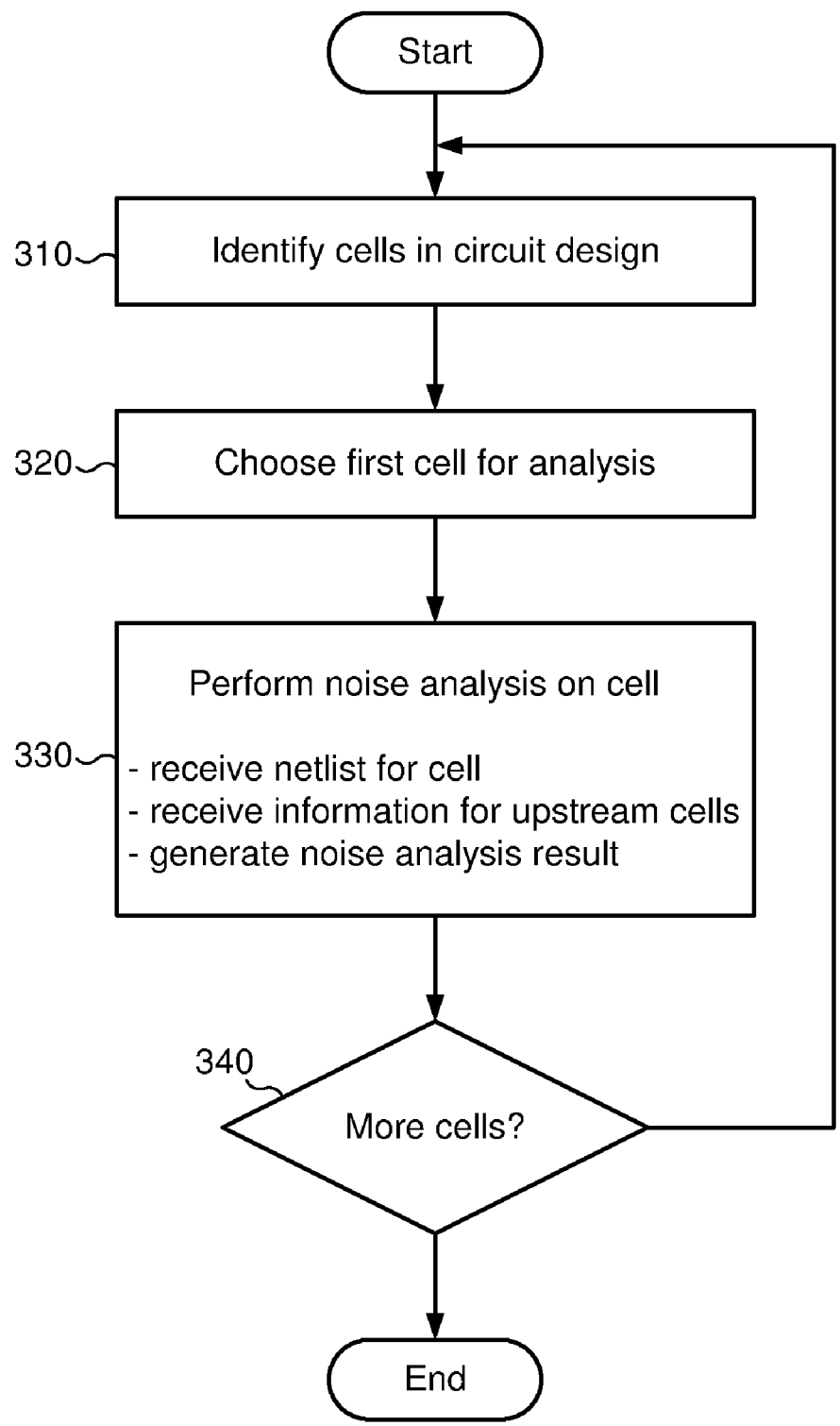
FIG. 3 is a flow diagram illustrating a method in accordance with one embodiment of the invention.

Referring to FIG. 3, a flow diagram illustrating the present method is shown. As shown in this figure, the cells in the circuit design are first identified (310.) Then, a noise analysis is performed for each of the cells, beginning with a first cell (320.) The analysis begins with the upstream cells and then proceeds to the downstream cells so that the noise information for the upstream cells will be available for use in the analysis of the downstream cells. For each cell, the netlist information for the cell being analyzed and the upstream cells is obtained and an analysis is performed based on this information (330.) As used here, "analysis" includes both the actual analysis of a cell and the re-use of a previously computed noise analysis result. As explained above, the noise analysis will be performed for each unique combination of a particular cell and the upstream components connected to its inputs. When all of the cells have been analyzed (340,) the hierarchical noise analysis is complete.

Figure 4:
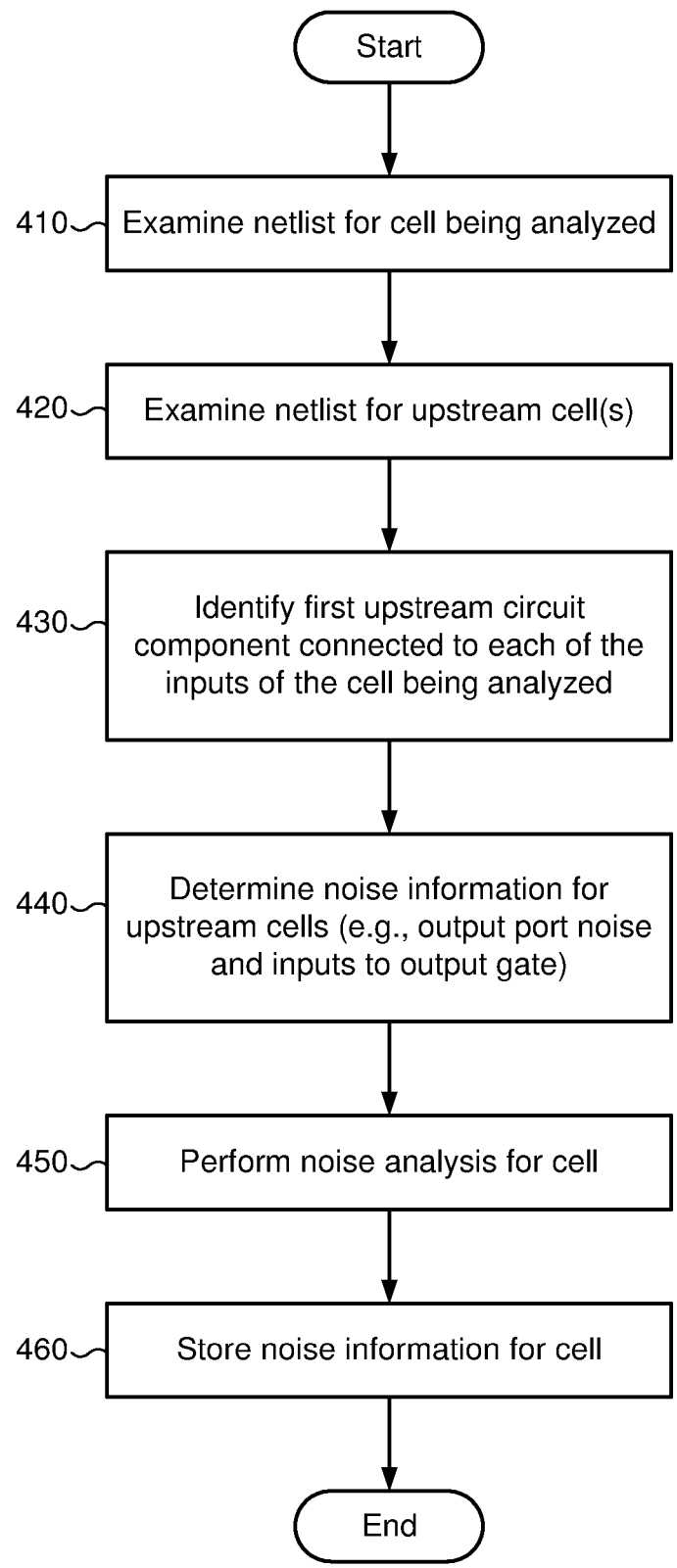
FIG. 4 is a flow diagram illustrating a method for noise analysis of a particular cell in accordance with one embodiment.

Referring to the FIG. 4, a flow diagram illustrating the noise analysis of a particular cell is shown in more detail. First, the netlist for the cell being analyzed is examined to determine the components and configuration of the cell (410.) The netlists for the cells upstream from the cell being analyzed are also examined (420) in order to identify the upstream components connected to the inputs of the cell being analyzed (430.) (By contrast, conventional hierarchical noise analysis omits steps 420 and 430.) The noise information corresponding to the upstream cells is also determined so that it can be taken into account in the analysis of the current cell (440.) This noise information includes not only the noise at the outputs of the upstream cells, but also the noise at the inputs to the upstream components which are connected to the current cell's inputs. This last piece of information is not used in conventional hierarchical noise analyses. Based upon the netlist for the current and upstream cells and the noise information for the upstream cells, a noise analysis is performed on the current cell (450.) Based on the analysis, a noise analysis result (noise information) is generated and saved for use in the analysis of cells that are downstream from the current cell (460.)

Referring to the circuit of FIG. 2, using the present analysis, the noise information of the inputs to the upstream components (ina1, ina2, ina3, inb1, inb2 and inb3) is used for the analysis of cell B instead of the output port noise information (out1, out2 and out3) obtained by the analysis of cell A. This is because the output port noise information (out1, out2 and out3) obtained by the analysis of cell A is not accurate compared to the noise information of out1, out2 and out3 obtained by the analysis of cell B. The noise levels at out1, out2 and out3 are therefore recalculated in the analysis of cell B (e.g., out1 is calculated by using the noise information of ina1 and inb1, and the netlists of cell A and cell B, including NAND 111, NOR 120 and the wire information of out1). Because the noise levels of out1, out2 and out3 are recalculated, the noise information of out1, out2 and out3 obtained by the analysis of cell A is not necessary for the analysis of cell B. If an output component in an upstream cell is not found (i.e., if the input port is directly connected to the output port by a wire), the output port noise information is used for analyses for downstream cells. This means that the output component input noise information (e.g., ina and inb in FIG. 2) is always necessary in FIG. 4 (box 440) if there are any output components, but output port noise (e.g., out1, out2 and out3) will be needed if there are no upstream components.

As noted above, the noise analysis for a particular cell is dependent upon not only the output port noise of the upstream cells, but also the input noise to the component that produces the output signal. For example, referring again to circuit 100 shown in FIG. 2, if the cell currently being analyzed is cell B, it is necessary to know not only the noise at the output of the NAND gate (e.g., out1,) but also the noise at the inputs to the NAND gate (e.g., ina1 and inb1.) This additional information should therefore be stored with the noise information for cell A. this information may, for example, take a form similar to that shown below.

```
Cell A property(
    Input port noise tolerance (a, b);
    Output component input noise (ina, inb);
    Output port noise (out);
    ...
);
```

By comparison, the noise information in a conventional hierarchical noise analysis would not include the inputs to the output component (e.g., the NAND gate.) This information is not provided in a conventional analysis because the output noise of the upstream cell is simply used as the input noise in the downstream cell.

It should be noted that the "steps" depicted in FIG. 4 need not be performed in the specific order in which they are shown. More specifically, the examination of the current cell's netlist, the examination of the upstream cells' netlists and the determination of noise information from the upstream cells can be performed in any order (or in parallel.) All of these steps will be completed before the noise analysis of the current cell is performed and before the noise information for the current cell is generated.

The present methods can be applied to hierarchical noise analysis in many different types of circuits. Circuit 100 shown in FIGS. 1 and 2 is a static digital circuit which may be implemented using, for example, CMOS technology. The present methods may also be applied to dynamic circuits such as the one shown in FIG. 5.

Circuit 500 includes three instances of cell A, the outputs of which are provided as inputs to cell B. Cell B includes a pair of precharge transistors 521, 522, while the instances of cell A (531-533) include pull-down transistors (501-503.) For a noise analysis of cell B using the present methods, it is necessary to identify the first upstream component connected to each of the inputs of cell B. The three inputs 511-513 are connected to pull-down transistors 501-503, respectively. Pull-down transistors 501-503 are therefore included in the analysis of cell B. Dotted line 540 therefore indicates the scope of the noise analysis for cell B, which includes pull-down transistors 501-503. It is also necessary to provide the noise inputs to the pull-down transistors (in1, in2, in3) for the analysis of cell B.

Figure 5:
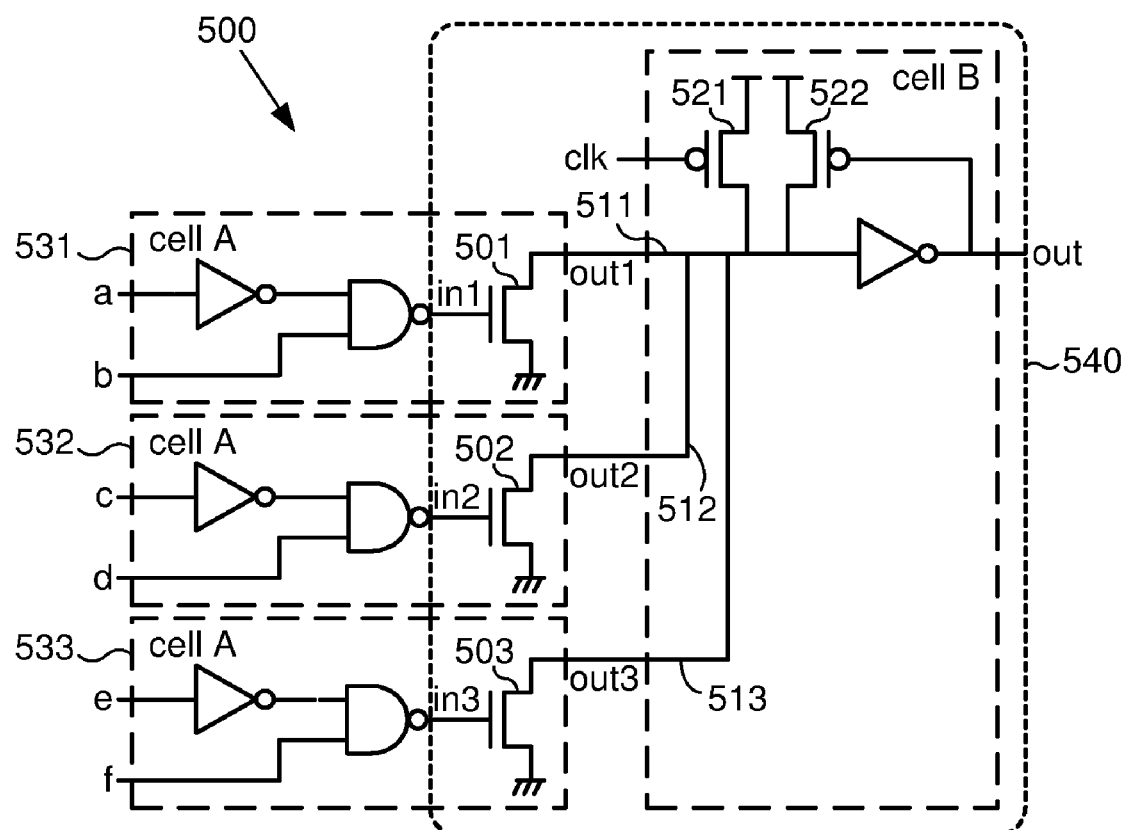
FIG. 5 is a diagram illustrating the incorporation of information from upstream circuit components in the analysis of a cell in a dynamic digital circuit in accordance with one embodiment.

The present methods can analyze the circuit of FIG. 5 properly. By contrast, conventional methods cannot properly analyze the circuit because cell A does not include precharge circuit information (521 and 522), thus causing generation of false noise information about out1, out2 and out3. These cell components are often seen in digital circuit designs like memory circuits for layout reasons. The fact that false analyses can result from the positioning of some of the cell A's far from cell B has been empirically verified. The present method can therefore be very important in the analysis of dynamic circuits.

As noted above, one of the goals of hierarchical noise analysis is to reduce computational requirements by reusing the noise analysis for cells that occur multiple times within a circuit design. It is therefore contemplated that one of the primary embodiments of the invention will be a software tool that incorporates the methods described herein. The software includes program instructions that can be executed by a computer to cause the computer to perform the described methods. The program instructions are stored on a computer-readable medium that may be separate from or integral to the computer.

The methods described in connection with the embodiments disclosed herein may be embodied in software (program instructions) executed by a processor, directly in hardware, or in a combination of the two. Software may reside in RAM memory, flash memory, ROM memory, EPROM memory, EEPROM memory, registers, hard disk, a removable disk, a CD-ROM, or any other form of storage medium known in the art. One exemplary storage medium may be coupled to a processor, such that the processor can read information from, and write information to, the storage medium. In the alternative, the storage medium may be integral to the processor. The processor and the storage medium may reside, for example, in an IC. Storage media containing program instructions that embody the present methods are themselves embodiments of the invention. Likewise, computer systems that are configured to perform the described methods are considered embodiments of the invention.

While the foregoing description presents several specific exemplary embodiments, there may be many variations of the described features and components in alternative embodiments. For example, the steps of the methods above may be rearranged. In another embodiment, the information derived from the components upstream of the cell being analyzed may be maintained separately from the upstream cells and retrieved for use with appropriate ones of the downstream cells. Many other variations will also be apparent to persons of skill in the art of the invention upon reading the present disclosure.

Those of skill in the art will understand that information and signals may be represented using any of a variety of different technologies and techniques. For example, data, instructions, commands, information, signals, bits, and symbols that may be referenced throughout the above description may be represented by voltages, currents, electromagnetic waves, magnetic or optical fields or the like. The information and signals may be communicated between components of the disclosed systems using any suitable transport media, including wires, metallic traces, vias, optical fibers, etc.

Those of skill will further appreciate that the various illustrative logical blocks, modules, circuits, and algorithm steps described in connection with the embodiments disclosed herein may be implemented as electronic hardware, computer software, or combinations of both. Whether the functionality of the methods is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein and recited within the following claims.

What is claimed is:

1. A software product comprising a non-transitory computer-readable medium containing one or more program instructions configured to cause a computer system to perform the method including:

identifying one or more inputs of a cell under analysis which is a configuration of circuit components;

identifying a corresponding first upstream circuit component which is upstream from the cell under analysis, wherein the first upstream circuit component is connected to the input of the cell under analysis, and the first upstream circuit component is a part of a first upstream cell;

performing the noise analysis for the cell under analysis based upon the configuration of the cell under analysis in combination with the first upstream circuit component and input to the first upstream circuit component; and storing a noise analysis result for the combination of the cell under analysis and the upstream circuit components.

2. The software product of claim 1, further comprising repeating the method for combinations of the cell with different upstream circuit components.

3. The software product of claim 1, further comprising, for subsequent occurrences of the combination of the cell and the upstream circuit components, reusing the stored noise analysis result for the combination in place of a repeated analysis of the combination.

4. The software product of claim 3, further comprising repeating the method for combinations of the cell with different upstream circuit components.

5. The software product of claim 1, further comprising repeating the method for each unique combination of one of a plurality of cells in the electronic circuit and a corresponding set of upstream circuit components connected to inputs of the one of the plurality of cells.

6. The software product of claim 1, further comprising identifying noise signals which are input to the upstream circuit components and performing the noise analysis for the cell further based upon the noise signals which are input to the upstream circuit components.

7. The software product of claim 1, wherein identifying the one or more inputs of the cell comprises examining a netlist for the cell and identifying inputs in the netlist.

8. The software product of claim 1, wherein identifying the first upstream circuit component connected to one of the inputs of the cell comprises examining a netlist for an upstream cell and identifying the first upstream circuit component in the netlist.

9. The software product of claim 1, wherein the cell under analysis is connected to upstream cells, wherein the upstream cells have the same circuit configuration as the cell under analysis and have the same noise as the cell under analysis.

10. A method comprising:

using a computer for:
identifying one or more inputs of a cell under analysis which is a configuration of circuit components;
identifying a corresponding first upstream circuit component which is upstream from the cell under analysis, wherein the first upstream circuit component is connected to the input of the cell under analysis, and the first upstream circuit component is a part of the first upstream cell;
performing the noise analysis for the cell under analysis based upon the configuration of the cell under analysis in combination with the first upstream circuit component and an input of the first upstream circuit component; and
storing a noise analysis result for the combination of the cell under analysis and the first upstream circuit component.

\* \* \* \* \*